United States Patent [19]
Hongu et al.

[11] 3,986,058
[45] Oct. 12, 1976

[54] TRANSISTOR BIASING CIRCUIT

[75] Inventors: Masayuki Hongu, Komae; Hiromi Kawakami, Yokohama, both of Japan

[73] Assignee: Sony Corporation, Tokyo, Japan

[22] Filed: Nov. 26, 1975

[21] Appl. No.: 635,283

[30] Foreign Application Priority Data
Dec. 13, 1974 Japan.............................. 49-143215

[52] U.S. Cl................................ 307/296; 307/297; 307/254; 330/22
[51] Int. Cl.² ........................................ H03K 17/00
[58] Field of Search ........... 307/254, 296, 297, 310; 330/22, 25

[56] References Cited
UNITED STATES PATENTS

| | | |
|---|---|---|
| 3,544,882 | 12/1970 | Tanaka ............................... 307/296 |
| 3,740,658 | 6/1973 | Loving, Jr............................ 330/22 |

Primary Examiner—Stanley D. Miller, Jr.
Assistant Examiner—B. P. Davis
Attorney, Agent, or Firm—Hill, Gross, Simpson, Van Santen, Steadman, Chiara & Simpson

[57] ABSTRACT

A transistor biasing circuit having circuit means for biasing two amplifier transistors so as to stabilize the DC collector currents thereof regardless of variations in the factor $h_{FE}$. The biasing circuit includes a biasing transistor having its emitter connected through specified resistances to the base circuits of the two amplifying transistors. In addition, a pair of series diode connected transistors are connected to the base circuit of the biasing transistor. By selecting specified values of the various resistance used in the biasing circuit arrangement, the desired stabilization technique is obtained. This circuit arrangement is particularly useful in the case of integrated circuits.

6 Claims, 7 Drawing Figures

TRANSISTOR BIASING CIRCUIT

BACKGROUND OF THE INVENTION

1. Field of the Invention

The field of art to which this invention pertains is transistor biasing circuits and in particular to circuits for stabilizing the DC collector currents of a pair of transistors regardless of variations in the factor $h_{FE}$.

2. Description of the Prior Art

Prior art transistor biasing circuits have been designed to produce predetermined collector currents for two transistors under given design criteria, however, under other criteria such as using one of the transistors as an attenuator, all of the requirements of such a circuit are not met by the prior art. For instance, certain resistance values in the circuit cannot be changed at will without affecting the input impedance of one of the stages or the dynamic range of operation of the circuit. Other resistance values must be maintained in order to prevent undesirable thermal noise.

A detailed description of two prior art circuits shown in FIGS. 1 and 2 is made in the section below entitled "Description of the Preferred Embodiment" in view of the fact that this detailed circuit description is closely related to portions of the circuit description of the invention shown in FIGS. 3 thru 7.

Reference is had to related application Ser. No. 635,365 assigned to same assignee and filed on even date herewith.

SUMMARY OF THE INVENTION

It is an important feature of the present invention to provide an improved transistor biasing circuit for a pair of transistors.

It is a principal object of the present invention to provide a transistor biasing circuit for a pair of transistors wherein the DC collector currents thereof can be stabilized regardless of variations in the factor $h_{FE}$.

It is another object of the present invention to provide a transistor biasing circuit as described above which includes a biasing transistor having its emitter circuit connected to the base circuits of a pair of transistors and having a pair of diode connected transistors coupled in the base circuit of the biasing transistor.

It is a further object of the present invention to provide a transistor biasing circuit as described above, wherein the resistors in the biasing circuits of each of the transistors are selected at a given ratio to provide optimum stabilization.

It is an additional object of the present invention to provide a transistor biasing circuit as described above, wherein a third diode connected transistor is connected in series with the emitter circuit of the biasing transistor to further improve stabilization.

These and other objects, features and advantages of the present invention will be understood in greater detail from the following description and the associated drawings wherein reference numerals are utilized to designate preferred embodiments.

DESCRIPTION OF THE PREFERRED EMBODIMENTS

The present invention relates to a transistor biasing circuit by which the bases of two transistors can be supplied with a stabilized biasing voltage under the condition of equal collector currents and different emitter resistances.

Figure 1:
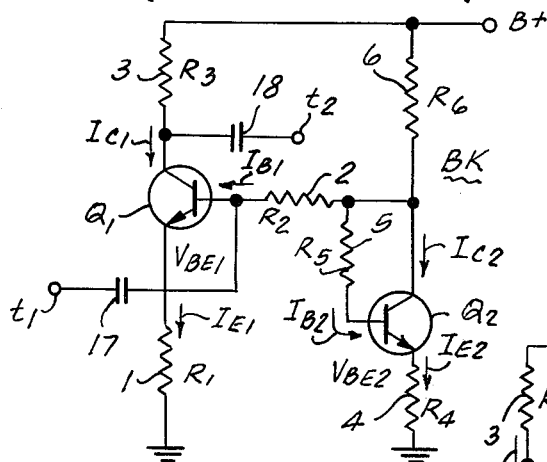
FIGS. 1 and 2 are schematics of prior art circuits useful in understanding the circuits of the present invention.

In the prior art circuit as shown in FIG. 1, when the base-emitter voltage $V_{BE}$ and current amplification factor $h_{FE}$ of a biasing transistor $Q_2$ are equal to those of an amplifying transistor $Q_1$ which has a base supplied with the biasing voltage; the values of the DC collector currents of both transistors and the ratio thereof can be designed at a predetermined value, even if the factor $h_{FE}$ is varied.

Such a biasing circuit is described below with reference to FIG. 1. An amplifying transistor $Q_1$ has an emitter which is grounded through a resistor 1, a collector connected through a load resistor 3 to a power or voltage source $B^+$, and a base connected through a capacitor 17 to a signal input terminal $t_1$. An output terminal $t_2$ is available at a capacitor 12 which is connected to the collector of the transistor $Q_1$.

A biasing circuit BK, consisting of a transistor $Q_2$ and resistors 4, 5 and 6, supplies a bias voltage to the base of the transistor $Q_1$. $Q_2$ has its emitter grounded through a resistor 4, and its collector connected through a resistor 6 to the voltage source $B^+$. A resistor 5 forms a base biasing circuit between collector and base, and the collector is connected through a resistor 2 the base of the transistor $Q_1$. The resistance values of the resistors 1 to 6 are referred to herein as $R_1$ to $R_6$; the voltages between the bases and emitters of the transistors $Q_1$ and $Q_2$, as $V_{BE1}$ and $V_{BE2}$; the DC base currents of the transistors $Q_1$ and $Q_2$, as $I_{B1}$ and $I_{B2}$; their DC collector currents as $I_{C1}$ and $I_{C2}$; and their DC emitter currents as $I_{E1}$ and $I_{E2}$, respectively.

The DC equation for voltage at the collector of the transistor $Q_2$ is as follows:

$$I_{E1}R_1 + V_{BE1} + I_{B1}R_2 = I_{E2}R_4 + V_{BE2} + I_{B2}R_5 \ldots \quad (1)$$

In the equation (1), if it is assumed that $V_{BE1} \doteq V_{BE2}$ and the factor $h_{FE}$ of each of the transistors $Q_1$ and $Q_2$ is equal, the result if the following equation (2):

$$\frac{1+h_{FE}}{h_{FE}}I_{C1}R_1 + \frac{1}{h_{FE}}I_{C1}R_2 = \frac{1+h_{FE}}{h_{FE}}I_{C2}R_4 + \frac{1}{h_{FE}}I_{C2}R_5 \quad (2)$$

If the following equation (3) is satisfied $$I_{c1} = k\, I_{c2} \quad\quad\quad (3)$$

where $k$ is a constant and the equation (2) is rearranged, the following equation (4) is derived.

$$\frac{1+h_{FE}}{h_{FE}}(k\,R_1 - R_4) + \frac{1}{h_{FE}}(k\,R_2 - R_5) = 0 \quad\quad (4)$$

The condition for satisfying the equation (4) regardless of variations in $h_{FE}$ is as follows:

$$k\,R_1 = R_4 \quad\quad\quad (5)$$

$$k\,R_2 = R_5 \quad\quad\quad (6)$$

When the resistances $R_1$, $R_2$, $R_4$ and $R_5$ are selected to satisfy the equations (5) and (6), the following equation is derived by substituting the equations (5) and (6) into the equation (2):

$$\frac{1+h_{FE}}{h_{FE}}R_1\,(I_{c1} - k\,I_{c2}) + \frac{1}{h_{FE}}R_2\,(I_{c1} - k\,I_{c2}) =$$

$$(I_{c1} - k\,I_{c2})\left(\frac{1+h_{FE}}{h_{FE}}R_1 + \frac{1}{h_{FE}}R_2\right) = 0$$

$$\therefore\; I_{c1} = k\,I_{c2} \quad\quad\quad (3)$$

This means that the equation (3) is obtained. Therefore it can be said that the equation (3) is satisfied when the resistances $R_1$, $R_2$, $R_4$ and $R_5$ are selected to satisfy equations (5) and (6).

It is well known that the DC current $I_{C1}$ is temperature stabilized when the equation (3) is satisfied, and this means that the current $I_{C1}$ does not change with temperature for the reason that:

$$I_{c2} = \frac{B - V_{BE2}}{R_6 + R_4} \doteq \frac{B}{R_6 + R_4}$$

Therefore when equation (3) is satisfied $I_{C1}$ and hence $I_{C2}$ is constant regardless of changes in $h_{FE}$.

An example where the bases of the two transistors $Q_1$ and $Q_3$ are biased by a biasing transistor $Q_2$ such as shown in FIG. 1 will be described with reference to FIG. 2 in which corresponding elements are marked with the same reference numerals as used in FIG. 1.

Figure 2:
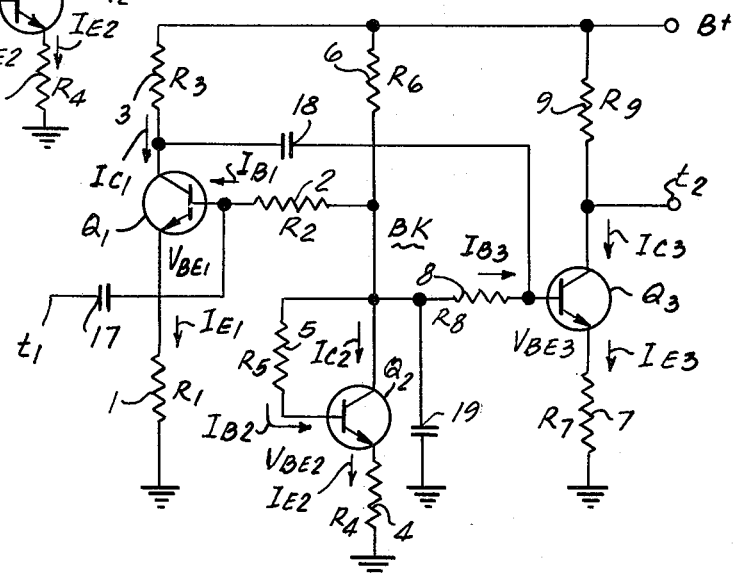
Figure 7:
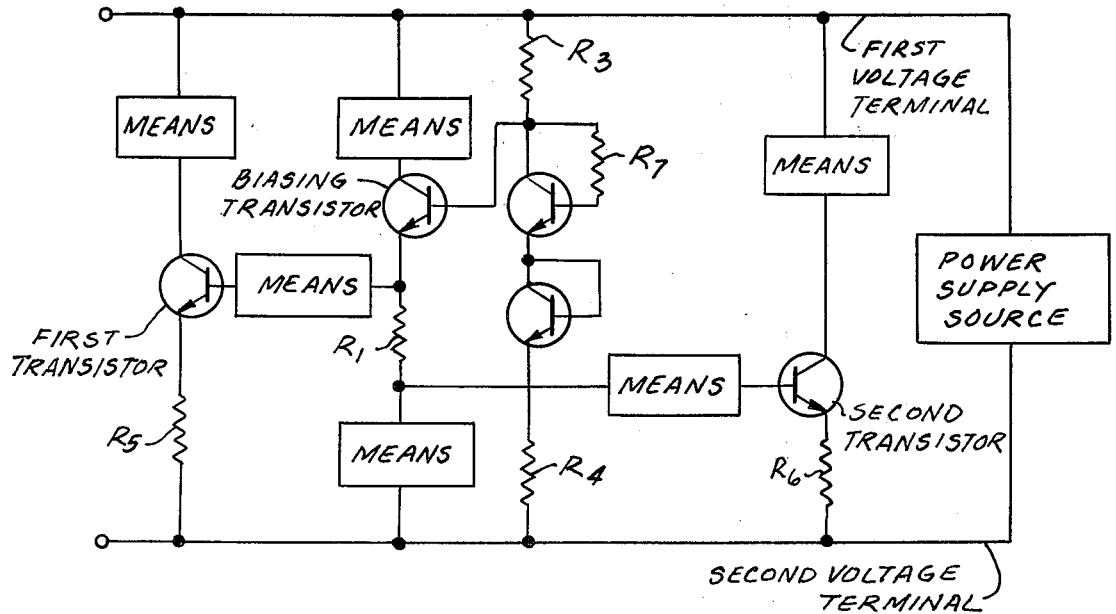
FIG. 7 is a simplified schematic of the invention showing the various elements identified in such a way as to be easily identified by language used in the claims appended hereto.

In FIG. 2, reference letter $Q_3$ shows an amplifying transistor which forms another transistor amplifier, and in this case the transistor $Q_3$ is connected at the rear state of the transistor $Q_1$. The emitter of the transistor $Q_3$ is grounded through a resistor 7. Its collector is connected through a load resistor 9 to the voltage source B$^+$, and an output terminal $t_3$ is coupled to the collector. The base of transistor $Q_3$ is connected through a capacitor 18 to the collector of the transistor $Q_1$. The collector of the transistor $Q_2$, of the biasing circuit BK, is connected through a resistor 8 to the base of the transistor $Q_3$. A capacitor 19, connected between the collector of the transistor $Q_2$ and ground prevents an input signal at the base of the transistor $Q_3$ from being fed back to the base of the transistor $Q_1$ through the resistors 8 and 2.

The resistance values of the resistors 7 to 9 are referred to herein as $R_7$ to $R_9$; the base-emitter voltage of the transistor $Q_3$ as $V_{BE3}$; its DC base current as $I_{B3}$; its DC collector current as $I_{C3}$; and its DC emitter current as $I_{E3}$. When the transistors $Q_1$ and $Q_3$ are formed, for example in a single semiconductor as an integrated circuit, the transistors $Q_1$ and $Q_3$ have substantially the same characteristics as each other. Therefore it is desirable for the collector DC currents, $I_{C1}$ and $I_{C3}$, to be stabilized at substantially the same value because the most appropriate DC operational currents of both transistors are substantially the same.

In the embodiment of FIG. 2 equations similar to (1) to (4) in the case in FIG. 1 are established, and when the resistances $R_4$, $R_5$, $R_7$ and $R_8$ are selected to satisfy the following equations (7) and (8) under the assumption of $V_{BE2} \doteq v_{BE3}$, the resulting equation (9) is satisfied:

$$k\,R_7 = R_4 \quad\quad\quad (7)$$

$$k\,R_8 = R_5 \quad\quad\quad (8)$$

$$I_{c3} = k\,I_{c2} \quad\quad\quad (9)$$

Accordingly, by satisfying equations (5), (6), (7) and (8), both equations (3) and (9) can be satisfied together, and both transistors $Q_1$ and $Q_3$ are stabilized with reference to ambient temperature under the condition of equal collector currents.

If transistor $Q_1$ is used as an attenuator having a gain of less than 1, then to make the dynamic range of the transistor $Q_1$ sufficiently wide, the resistance $R_1$ is selected large. It may appear unusual to use a transistor amplifier having a gain less than 1 in combination with another transistor amplifier having a high gain much greater than 1. However such a circuit construction is often used to control the total gain of the two cascaded transistor amplifiers. Usually the preceding amplifier which operates as an attenuator is a gain controlled amplifier, but the related circuit of FIG. 3 does not show any gain control means for the sake of brevity.

Figure 4:
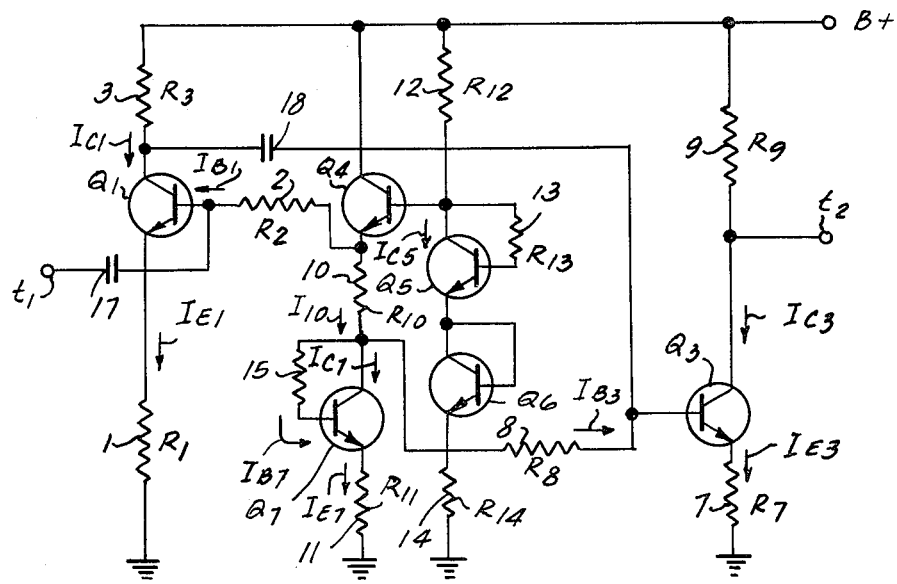

FIG. 4 shows another case in which each of the transistors $Q_1$ and $Q_3$ has a gain greater than 1, and the succeeding transistor $Q_3$ has a wider dynamic range than the preceding transistor $Q_1$.

Where $Q_1$ is used as an attenuator, if the gain of the transistor $Q_1$ is kept constant it is necessary to make the resistance $R_3$ great in proportion to the resistance $R_1$. It is also necessary to make the collector current $I_{C1}$ constant, and the resistances $R_2$, $R_4$ and $R_5$ are required to be great in proportion to the resistance $R_1$.

If it is possible to increase the resistances $R_7$, $R_8$ and $R_9$ together in proportion to the resistance $R_1$, there may not be a problem. There may be, however, a situation where the resistance $R_9$ cannot be made sufficiently large. The reason is as follows. Since the resistance $R_9$ includes the input impedance of the following stage, namely the amplifier circuit associated with the transistor $Q_3$, which requires a low input impedance, $R_9$ cannot be made suitably large.

Accordingly, when the resistances $R_7$ and $R_8$ are selected great in proportion to $R_1$ and $R_2$ so as to make the collector DC current $I_{C3}$ constant, the AC current gain determined by the ratio $R_9/R_7$ becomes small.

Also, if the resistance $R_7$ becomes too great, an intense thermal noise may occur. Therefore, it is not desirable to make the resistance $R_7$ great. In this case, in order to make the dynamic range of the first stage amplifier circuit wide enough, the resistance $R_1$ must be selected great regardless of the thermal noise.

There is another case where the resistance $R_1$ must be small, while the resistance $R_7$ is required to be large in order to make the gain of the transistor $Q_1$ sufficiently high and to make the dynamic range of the transistor $Q_3$ sufficiently wide. When the resistances $R_4$ and $R_5$ of the biasing circuit BK and the resistances $R_1$ and $R_2$ are selected to make the transistor $Q_1$ stabilized at the most appropriate collector current, the transistor $Q_3$ cannot be stabilized at the same collector current. On the other hand when the resistances $R_4$ and $R_5$ of the biasing circuit BK and the resistances $R_7$ and $R_8$ are selected to make the transistor $Q_3$ stabilized at the most appropriate collector current, the transistor $Q_1$ cannot be stabilized at the same collector current.

In view of the above defects of the prior art, the present invention provides a single biasing circuit for biasing both bases of two transistors regardless of the difference of the resistance values mentioned above.

Furthermore, the present invention provides a biasing circuit by which the DC collector currents of respective transistors can be held at a desired constant value regardless of variations in the factor $h_{FE}$ by independently selecting the emitter resistances of the respective transistors.

Figure 3:
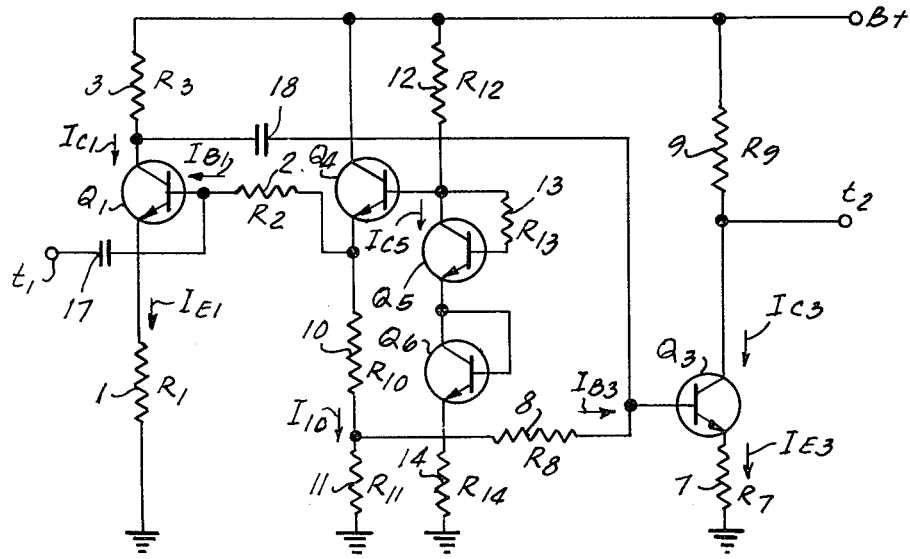
FIGS. 3 and 4 are detailed schematics of the transistor biasing circuit of the present invention showing the use of specified resistors and diode connected transistors.

FIG. 3 shows an embodiment of the present invention in which elements corresponding to those of FIGS. 1 and 2 are marked with the same reference numerals and letters.

In FIG. 3, the emitter of a biasing transistor $Q_4$ is grounded through resistors 10 and 11, and the collector thereof is connected to the voltage source $B^+$. The voltage source $B^+$ is grounded through a resistor 12, a diode connected transistor $Q_5$, a diode connected transistor $Q_6$ and a resistor 14. The collector and base of $Q_5$ are connected through $R_{12}$, while the collector and base of $Q_6$ are connected directly. The connection point between the resistor 12 and the diode connected transistor $Q_5$ is connected to the base of the transistor $Q_4$. Thus, a base biasing circuit for the transistor $Q_4$ is formed. The emitter of the transistor $Q_4$ is connected through the resistor 2 to the base of the first transistor $Q_1$ to supply a base bias to the latter transistor, and the connection point between the resistors 10 and 11 is connected through a resistor 8 to the base of the second transistor $Q_3$ to supply a base bias thereto. The remaining circuit features of FIG. 3 are substantially the same as those shown in FIG. 2.

The resistance values of resistors 10 to 14 are referred to herein as $R_{10}$ to $R_{14}$; the DC collector current of the diode connected transistor $Q_5$ as $I_{C5}$; and the DC current flowing through the resistor 10 as $I_{10}$. It is also assumed that the current amplification factors, $h_{FE}$, of the transistors $Q_1$ to $Q_6$ are equal (when they are varied, they vary equally) and their base-emitter voltages $V_{BE}$ are substantially equal, as would be the case in an integrated circuit.

The input inpedance $Z_{in}$ viewed from the emitter of the transistor $Q_4$ is expressed by the following equation (10) if it is assumed that the emitter resistance of the transistor $Q_4$ is taken as $R_E$ and the equivalent resistance of a parallel circuit, consisting of resistor 12 and a series arrangement of transistor type diodes $Q_5$, $Q_6$, and the resistor 14 is taken as $R_P$.

$$Z_{in} = \frac{R_P}{h_{FE}} + R_E \quad (10)$$

As may be apparent from the equation (10), the input impedance $Z_{in}$ can be made sufficiently small, so that the base input signal to the base of the second transistor $Q_3$ is kept from being fed back to the base of the first transistor $Q_1$ through the resistors 8, 10 and 2 without using a capacitor such as the capacitor 19 used in FIG. 2.

The DC voltage at the emitter of the transistor $Q_4$ is expressed by the following equation:

$$\frac{1+h_{FE}}{h_{FE}}I_{C1}R_1 + V_{BE} + \frac{1}{h_{FE}}I_{C1}R_2 = \frac{1+h_{FE}}{h_{FE}}I_{C5}R_{14}$$
$$+ V_{BE} + V_{BE} + \frac{1}{h_{FE}}I_{C5}R_{13} - V_{BE} \quad (11)$$

If the right side factors of equation (11) are transposed to the left and the equation re-arranged, the following equation (12) is obtained:

$$\frac{1+h_{FE}}{h_{FE}}(I_{C1}R_1 - I_{C5}R_{14}) + \frac{1}{h_{FE}}(I_{C1}R_2 - I_{C5}R_{13}) = 0 \quad (12)$$

If it is assumed that $I_{C1} = k\, I_{C5}$, then equation (12) can be written as follows:

$$I_{C5}\left\{\frac{1+h_{FE}}{h_{FE}}(k\,R_1 - R_{14}) + \frac{1}{h_{FE}}(k\,R_2 - R_{13})\right\} = 0 \quad (13)$$

The condition for satisfying equation (13) regardless of variations in the factor $h_{FE}$ is as follows:

$$k\,R_1 = R_{14} \ldots \quad (14)$$

$$k\,R_2 = R_{13} \ldots \quad (15)$$

Conversely, if the resistances $R_1$, $R_2$, $R_{13}$ and $R_{14}$ are selected to satisfy the conditions (14) and (15), the equation (13) is satisfied and the condition $I_{C1} = k\,I_{C5}$ is obtained.

Thus, the conditions for stabilizing $Q_1$ are met. The DC voltage at the emitter of the transistor $Q_4$ is expressed by the following equation (16):

$$\frac{1+h_{FE}}{h_{FE}}I_{C3}R_7 + V_{BE} + \frac{1}{h_{FE}}I_{C3}R_8 + I_{10}R_{10}$$
$$= \frac{1+h_{FE}}{h_{FE}}I_{C5}R_{14} + V_{BE} + V_{BE} + \frac{1}{h_{FE}}I_{C5}R_{13} - V_{BE} \quad (16)$$

Furthermore, the term $I_{10}R_{10}$ can be expressed as follows:

$$I_{10}R_{10} = \left\{\frac{\frac{1+h_{FE}}{h_{FE}}I_{C3}R_7 + V_{BE} + \frac{1}{h_{FE}}I_{C3}R_8}{R_{11}} \right.$$
$$\left. + \frac{1}{h_{FE}}I_{C3}\ R_{10}\right\} \quad (17)$$

If the equation (17) is substituted into the equation (16), and the equation (16) is re-arranged, the following equation (18) is derived:

$$\frac{1+h_{FE}}{h_{FE}}\left\{(1+\frac{R_{10}}{R_{11}})\,I_{C3}R_7 - I_{C5}R_{14}\right\} + \frac{1}{h_{FE}}$$

-continued $$\left[\left\{(1+\frac{R_{10}}{R_{11}})R_8+R_{10}\right\}I_{c3}-I_{c5}R_{13}\right]+\frac{R_{10}}{R_{11}}V_{BE}=0 \quad (18)$$

If the resistances $R_8$, $R_{10}$ and $R_{11}$ are selected to satisfy the conditions $R_{10}/R_{11} << 1$ and $R_{10} << R_8$, the equation (18) can be expressed as follows:

$$\frac{1+h_{FE}}{h_{FE}}(I_{c3}R_7-I_{c5}R_{14})+\frac{1}{h_{FE}}(I_{c3}R_8-I_{c5}R_{13})$$

$$+\frac{R_{10}}{R_{11}}V_{BE} \doteq 0 \quad (19)$$

The equation (19) can be modified as follows:

$$\frac{1+h_{FE}}{h_{FE}}\left\{I_{c3}(R_7+\frac{h_{FE}}{1+h_{FE}}\cdot\frac{1}{I_{c3}}\cdot\frac{R_{10}}{R_{11}}V_{BE})\right.$$

$$\left.-I_{c5}R_{14}\right\}+\frac{1}{h_{FE}}(I_{c3}R_8-I_{c5}R_{13}) \doteq 0 \quad (20)$$

The conditions for satisfying the equation (20) regardless of the factor $h_{FE}$ under the assumption, $I_{C3}=k \, I_{C5}$, is as follows:

$$k(R_7+\frac{h_{FE}}{1+h_{FE}}\cdot\frac{1}{k\,I_{c5}}\cdot\frac{R_{10}}{R_{11}}V_{BE})=R_{14} \quad (21)$$

$$k \, R_8 = R_{13} \ldots \quad (22)$$

If $h_{FE}$ is $>> 1$, then $$\frac{h_{FE}}{1+h_{FE}} \doteq 1$$

is satisfied and equation (21) can be rewritten as follows:

$$k \, R_7 = R_{14} - \frac{R_{10}}{R_{11}}\cdot\frac{V_{BE}}{I_{c5}} \quad (23)$$

Conversely, when the values $R_7$, $R_8$, $R_{10}$, $R_{11}$, $R_{13}$, $R_{14}$, $I_{C5}$ and $V_{BE}$ are selected to satisfy the equations (22) and (23), $I_{C3}$ can be made to satisfy the equation $I_{C3} = k \, I_{C5}$ regardless of variations in $h_{FE}$.

Therefore if the resistances $R_1$, $R_2$, $R_7$, $R_8$, $R_{10}$, $R_{11}$, $R_{13}$ and $R_{14}$, the collector current $I_{C5}$ of the transistor $Q_5$, and the base to emitter voltage $V_{BE}$, are selected to satisfy the equations (14), (15), (22) and (23), then the equation, $I_{C1} = I_{C3} = k \, I_{C5}$ is satisfied, and both the transistors $Q_1$ and $Q_3$ are stabilized with the most appropriate collector currents under the condition $R_1 > R_7$.

In FIG. 2, when the voltage of the voltage source B⁺ is selected at 12V; $R_1 = 50$ ohms; $R_2 = 5k$ ohms; $R_3 = 0$ ohm; $R_4 = 150$ ohms; $R_5 = 15 \, k$ ohms; $R_6 = 9.1k$ ohms; $R_7 = 30$ ohms; $R_8 = 9.1 \, k$ ohms, $R_9 = 0$ ohm; and the capacitors 18 and 19 are removed, the variation factor of $I_{C1}$ is 0.00114 and that of $I_{C3}$ is 0.14223 under the variation of $h_{FE}$ from 200 to 100.

In reference to FIG. 3, when the source B⁺ is selected as 12V; $R_1 = 50$ ohms; $R_2 = 1k$ ohms; $R_3 = 3k$ ohms; $R_7 = 30$ ohms; $R_8 = 1k$ ohm; $R_9 = 3k$ ohms; $R_{10} = 60$ ohms; $R_{11} = 900$ ohms; $R_{12} = 5k$ ohms; $R_{13} = 1.5k$ ohms; $R_{14} = 70$ ohms; and the capacitors 18 and 19 are removed, the variation factor of $I_{C1}$ is 0.0087237 and that of $I_{C3}$ is 0.0234443 under the variation of $h_{FE}$ from 200 to 100. Hence there is a substantial improvement over FIG. 2.

With the circuit in FIG. 3, the term $V_{BE}$ is present in equation (23), so that the relationship, $I_{C1} = I_{C3} = k \, I_{C5}$ may not be satisfied due to the scatter and temperature variations of $V_{BE}$.

FIG. 4 shows another example of the present invention which further improves the stabilization of $Q_3$ over the circuit of FIG. 3 in which parts corresponding to those in FIG. 3 are marked with the same reference numerals, and their description will be omitted for the sake of brevity.

In FIG. 4, a diode connected transistor $Q_7$ is added and connected in series with the resistor 11. The connection point between the diode connected transistor $Q_7$ and the resistor 10 is connected through the resistor 8 to the base of the second transistor $Q_3$. The collector and the base of the diode connected transistor $Q_7$ are connected through a resistor 15. Other features of the circuit of FIG. 4 are substantially the same as that of FIG. 3.

An analysis of the circuit in FIG. 4 is described below under the assumption that the DC emitter current of the transistor type diode $Q_7$ is $I_{E7}$, its DC base current as $I_{B7}$, the resistance value of the resistor 15 as $R_{15}$, and that the transistor type diode $Q_7$ has the same factor $h_{FE}$ as those of the transistors $Q_1$ to $Q_6$ (when the factor $h_{FE}$ varies, the variation thereof is equal) and the same base-emitter voltage $V_{BE}$.

It may be understood that the above equations (10) to (15) are also true in the circuit shown in FIG. 4.

The DC voltage at the emitter of the transistor $Q_4$ is expressed by the following equation (24), which is the same as equation (16):

$$\frac{1+h_{FE}}{h_{FE}}I_{c3}R_7+V_{BE}+\frac{1}{h_{FE}}I_{c3}R_8+I_{10}R_{10}$$

$$=\frac{1+h_{FE}}{h_{FE}}I_{c5}R_{14}+V_{BE}+V_{BE}+\frac{1}{h_{FE}}I_{c5}R_{13}-V_{BE} \quad (24)$$

The DC voltage at the collector of the diode connected transistor $Q_7$ is expressed by the following equation (25):

$$\frac{1+h_{FE}}{h_{FE}}I_{c3}R_7+V_{BE}+\frac{1}{h_{FE}}I_{c3}R_8=\frac{1+h_{FE}}{h_{FE}}I_{c7}R_{11}$$

$$+V_{BE}+\frac{1}{h_{FE}}I_{c7}R_{15} \quad (25)$$

If the terms at the right side of the equation (25) are transposed to the left and the equation is re-arranged, the following equation (26) is obtained.

$$\frac{1+h_{FE}}{h_{FE}}(I_{c3}R_7-I_{c7}R_{11})+\frac{1}{h_{FE}}(I_{c3}R_8-I_{c7}R_{15})=0 \quad (26)$$

$$\text{If } R_7 = k_1 R_{11} \text{ and } R_8 = k_1 R_{15} \ldots \quad (26)'$$

(where $k_1$ is a constant) are assumed, equation (26) can be rewritten as follows:

$$(k_1 I_{c3}-I_{c7})\left(\frac{1+h_{FE}}{h_{FE}}R_{11}+\frac{1}{h_{FE}}R_{15}\right)=0 \quad (27)$$

The condition for satisfying equation (27) regardless of variations in the factor $h_{FE}$ is as follows:

$$I_{c7}=k_1 I_{c3} \ldots \quad (28)$$

While, the current $I_{10}$ is expressed as follows:

$$I_{10} = \frac{1+h_{FE}}{h_{FE}} k_1 I_{c3} + \frac{1}{h_{FE}} I_{c3} \tag{29}$$

If equation (29) is substituted into equation (24) and the latter is re-arranged, the following equation (30) is obtained.

$$\frac{1+h_{FE}}{h_{FE}} \left\{ I_{c3}(R_7 + k_1 R_{10}) - I_{c5} R_{14} \right\} + \frac{1}{h_{FE}}$$
$$\left\{ I_{c3}(R_8 + R_{10}) - I_{c5} R_{13} \right\} = 0 \tag{30}$$

If $R_{14} = k(R_7 + k_1 R_{10})$ and $R_{13} = k(R_8 + R_{10})$ are substituted into equation (30), the following equation (31) is obtained.

$$(I_{c3} - k I_{c5}) \left\{ \frac{1+h_{FE}}{h_{FE}}(R_7 + k_1 R_{10}) + \frac{1}{h_{FE}}(R_8 + R_{10}) \right\} = 0$$
$$\tag{31}$$

The condition for satisfying equation (31) regardless of the factor $h_{FE}$ is as follows:

$$I_{c3} = k I_{c5} \ldots \tag{32}$$

Accordingly, if the resistances $R_7$, $R_8$ and $R_{10}$ are selected to satisfy the following equations (33) and (34), equation (31) and hence equation (32) can be satisfied.

$$R_{14} = k(R_7 + k_1 R_{10}) \ldots \tag{33}$$

$$R_{13} = k(R_8 + R_{10}) \ldots \tag{34}$$

Therefore if the resistances $R_1$, $R_2$, $R_7$, $R_8$, $R_{10}$, $R_{11}$, $R_{13}$, $R_{14}$ and $R_{15}$ are selected to satisfy the equations (14), (15), (26)', (33) and (34), and $I_{C1} = I_{C3} = k I_{C5}$ is satisfied, then both the transistors $Q_1$ and $Q_3$ are stabilized at the most appropriate collector currents under the condition $R_1 > R_7$.

It is to be understood from the equations (26)', (33) and (34) that the circuit of FIG. 4 further improves the stabilization of $Q_3$ over the arrangement shown in FIG. 3.

In the embodiment of the present invention described above, the emitter of the transistor $Q_4$ is grounded through the resistors 10 and 11 for biasing; its collector is connected to the voltage source B+; the voltage source B+ is grounded through the resistor 12, the transistor type diodes $Q_5$, $Q_6$ and the resistor 14; and the connection point between the resistor 12 and the transistor type diode $Q_5$ is connected to the base of the transistor $Q_4$ to form the base biasing circuit for the transistor $Q_4$. Furthermore, the emitter of the transistor $Q_4$ is connected to the base of the first transistor $Q_1$ or $Q_3$ to supply the base bias thereto; the connection point between the resistors 10 and 11 is connected to the base of the second transistor $Q_3$ or $Q_1$ to supply the base bias thereto; and the emitters of the first and second transistors $Q_1$, $Q_3$ are grounded through resistors 1 and 7, respectively, to form the base biasing circuit for the transistors $Q_1$, $Q_3$. Therefore, if the resistances $R_1$ and $R_7$ of the first and second transistors $Q_1$ and $Q_3$ are selected suitably, their DC collector currents can be held at the desired constant values regardless of variations in the factor $h_{FE}$, and the base input signal to the second transistor $Q_3$ is kept from being fed back through the resistors 8 and 2 to the base of the first transistor $Q_1$.

Also this transistor biasing circuit of the invention is preferred when the circuit is formed as an IC.

Figure 5:
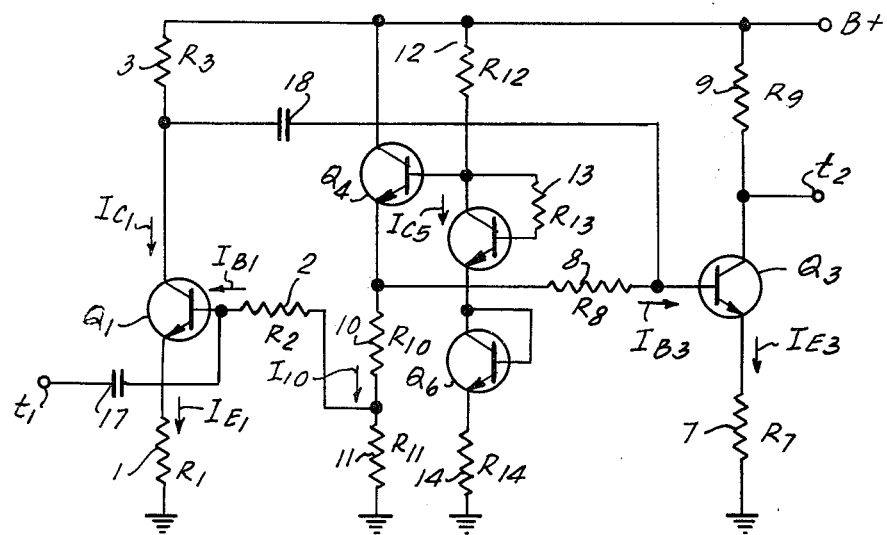
FIGS. 5 and 6 are schematics of circuits similar to FIGS. 3 and 4 with the connection points of the base circuits of the transistors $Q_1$ and $Q_3$ interchanged in order to make the gain of the first transistor high and the gain of the second transistor low. In other respects these circuits are identical to FIGS. 3 and 4.
Figure 6:
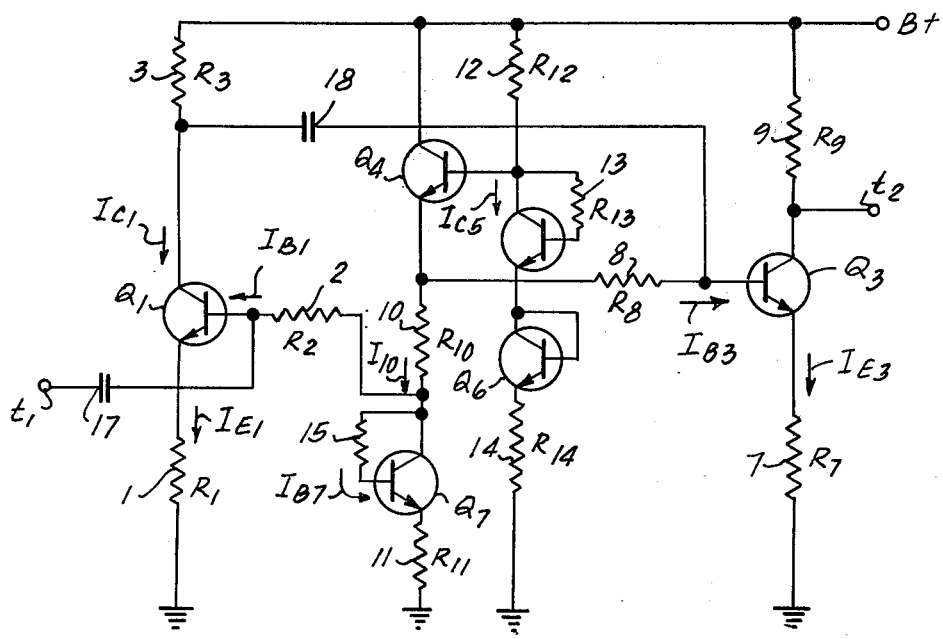

When the emitter resistor 1 of the preceding transistor $Q_1$ is desired to be small, and the emitter resistor 7 of the following transistor $Q_3$ is desired to be great in order to make the gain of the preceding transistor $Q_1$ high and the dynamic range of the following transistor $Q_3$ sufficiently wide, (wider than $Q_1$), the circuits shown in FIGS. 5 and 6 are used instead of the circuits of FIGS. 3 and 4, respectively.

The only difference between FIGS. 5 and 6 as compared to FIGS. 3 and 4 is that the base biasing connections for the transistors $Q_1$ and $Q_3$ are reversed. Specifically in FIG. 5, the base of circuit of $Q_3$ is connected directly to the emitter of $Q_4$, and the base circuit of $Q_1$ is connected between $R_{10}$ and $R_{11}$, which is just the opposite of the connections in FIG. 3. These are the same differences between FIGS. 4 and 6.

Therefore it is understood that the transistors $Q_1$ and $Q_3$ of FIGS. 5 and 6 operate substantially in the same manner as the transistors $Q_3$ and $Q_1$, respectively of FIGS. 3 and 4, and that the transistors $Q_1$ and $Q_3$ of FIGS. 5 and 6 are stabilized under the condition of $I_{C1} = I_{C3} = k I_{C5}$ and $R_1 < R_7$. Accordingly of FIGS. 5 and 6, detailed explanation would be repetitious and is therefore omitted.

What we claim is:

1. A transistor biasing circuit comprising: a biasing transistor having base, emitter and collector electrodes; first and second voltage terminals for being connected to a power supply source; first means for connecting the collector electrode of said biasing transistor to said first voltage terminal; a first resistance and a second means serially connected between the emitter of said biasing transistor and said second voltage terminal; a series branch including a third resistance, first and second diode connected transistors, and a fourth resistance connected between said first and second voltage terminals; first and second amplifying transistors each having base, emitter and collector electrodes; fifth and sixth resistances connected between the second voltage terminal and the respective emitter electrodes of the first and second amplifying transistors; third and fourth means for connecting the collector electrodes respectively, of the first and second amplifying transistors to the first voltage terminal; first DC current conductive means for connecting the base electrode of the first amplifying transistor to the emitter electrode of the biasing transistor; and second DC current conductive means for connecting the base electrode of the second amplifying transistor to a connection point between the first resistance and the second means.

2. A transistor biasing circuit in accordance with claim 1 wherein said first resistance, second means, fourth, fifth and sixth resistances have resistance values expressed by $R_1$, $R_2$, $R_4$, $R_5$ and $R_6$ respectively, the base-emitter voltage and the DC current of the diode connected transistors are expressed by $V_{BE}$ and $I_1$ respectively, and the values of said resistances voltage and current is selected to satisfy the following equation:

$$k R_5 = R_4$$

and $$k R_6 = R_4 - \frac{R_1}{R_2} \frac{V_{BE}}{I_1}$$

where $k$ is a constant.

3. A transistor biasing circuit according to claim 2, wherein one of said first and second diode connected transistors has a seventh resistance connected between its collector and base electrodes, said DC current conductive means for connecting the base electrode of the first amplifying transistor to the emitter electrode of the biasing transistor includes an eighth resistance, said DC current conductive means for connecting the base electrode of the second amplifying transistor to a connection point between the first resistance and second means includes a ninth resistance, and the resistance values $R_7$, $R_8$ and $R_9$ of the seventh, eighth and ninth resistors are selected to substantially satisfy the following equation:

$$k R_8 = k R_9 = R_7$$

4. A transistor biasing circuit in accordance with claim 3, wherein said means for connecting the collector electrodes of the first and second amplifying transistors to the first voltage terminal includes a first load connected between the collector electrode of the first amplifying transistor and the first voltage terminal and a second load connected between the collector electrode of the second amplifying transistor and the first voltage terminal, and said transistor biasing circuit further comprising:
A. a signal input terminal connected to the base electrode of one of the first and second amplifying transistors,
B. means for connecting the collector electrode of said one of the first and second amplifying transistors to the base electrode of the other transistor, and
C. signal output means connected to the collector electrode of said other transistor.

5. A transistor biasing circuit in accordance with claim 1, wherein one of said first and second diode connected transistors includes a seventh resistance connected between its collector and base electrodes, said DC current conductive means for connecting the base electrode of the first amplifying transistor to the emitter electrode of the biasing transistor includes an eighth resistance, said DC current conductive means for connecting the base electrode of the second amplifying transistor to a connection point between the first resistance and the second means includes a ninth resistance, said transistor biasing circuit further comprising:
A. a third diode connected transistor connected between said first resistance and said second means, and
B. a tenth resistance connected between the collector and base electrodes of said third diode connected transistor, said DC current conductive means, which connects the base electrode of the second amplifying transistor to a connection point between the first resistance and said second means, being connected to a circuit point between the first resistor and the third diode connected transistor, and the resistance values $R_1$, $R_2$, $R_4$, $R_5$, $R_6$, $R_7$, $R_8$, $R_9$ and $R_{10}$ are selected to substantially satisfy the following equations:

$$k R_5 = R_4$$

$$k R_8 = R_7$$

$$R_6 = k_1 R_2$$

$$R_9 = k_1 R_{10}$$

$$R_4 = k (R_6 + k_1 R_1)$$

$$R_7 = k (R_9 + R_1)$$

where $k$ and $k_1$ are constants, respectively.

6. A transistor biasing circuit according to claim 5, wherein said third and fourth means for connecting the collector electrodes of the first and second amplifying transistors to the first voltage terminal includes first and second loads and said transistor biasing circuit further comprising:
A. a signal input terminal connected to the base electrode of one of the first and second amplifying transistors,
B. means for connecting the collector electrode of said one of the first and second amplifying transistors to the base electrode of the other transistor, and
C. signal output means connected to the collector electrode of said other amplifying transistor.

* * * * *